United States Patent
Zhu et al.

(10) Patent No.: US 11,158,639 B2
(45) Date of Patent: Oct. 26, 2021

(54) ASYMMETRIC FINFET IN MEMORY DEVICE, METHOD OF FABRICATING SAME AND SEMICONDUCTOR DEVICE

(71) Applicant: Changxin Memory Technologies, Inc., Anhui (CN)

(72) Inventors: Rongfu Zhu, Hefei (CN); Dingyou Lin, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 67 days.

(21) Appl. No.: 15/930,253

(22) Filed: May 12, 2020

(65) Prior Publication Data
US 2020/0273863 A1    Aug. 27, 2020

Related U.S. Application Data

(63) Continuation of application No. PCT/CN2018/115267, filed on Nov. 13, 2018.

(30) Foreign Application Priority Data

Nov. 13, 2017    (CN) .......................... 201711116015.4

(51) Int. Cl.
*H01L 27/108* (2006.01)
*G11C 5/06* (2006.01)
(Continued)

(52) U.S. Cl.
CPC ........ *H01L 27/10826* (2013.01); *G11C 5/063* (2013.01); *H01L 27/10879* (2013.01);
(Continued)

(58) Field of Classification Search
CPC ......... H01L 27/10826; H01L 27/10879; H01L 27/10891; H01L 29/0649; H01L 29/66795;
(Continued)

(56) References Cited

U.S. PATENT DOCUMENTS

| 8,830,732 B2 | 9/2014 | Liaw |
| 9,299,711 B2 | 3/2016 | Song et al. |

(Continued)

FOREIGN PATENT DOCUMENTS

| CN | 103681865 A | 3/2014 |
| CN | 103854697 A | 6/2014 |

(Continued)

OTHER PUBLICATIONS

PCT International Search Report and the Written Opinion dated Feb. 20, 2019, issued in related International Application No. PCT/CN2018/115267 (7 pages).

(Continued)

*Primary Examiner* — Mohammed R Alam
(74) *Attorney, Agent, or Firm* — Sheppard Mullin Richter & Hampton LLP (57) ABSTRACT

An asymmetric fin field-effect transistor (FinFET) in a memory device, a method for fabricating the FinFET and a semiconductor device are disclosed. In the provided FinFET and method, each of the active areas comprises a fin, a length of a first end of the fin on a first side of the active area and covered by the word line being different from a length of a second end of the fin on a second side of the active area and covered by the word line. For this reason, the present invention allows reduced process difficulty. In addition, the different lengths of the word lines can induce a weaker unidirectional electric field which suffers from much less current leakage, compared to a bidirectional electric field created in word lines with equal such length.

12 Claims, 6 Drawing Sheets

(51) Int. Cl.
*H01L 29/06* (2006.01)
*H01L 29/66* (2006.01)
*H01L 29/78* (2006.01)

(52) U.S. Cl.
CPC .... *H01L 27/10891* (2013.01); *H01L 29/0649* (2013.01); *H01L 29/66795* (2013.01); *H01L 29/7853* (2013.01)

(58) Field of Classification Search
CPC ............... H01L 29/7853; H01L 29/785; H01L 27/10894; H01L 27/10897; G11C 5/063
See application file for complete search history.

(56) References Cited

U.S. PATENT DOCUMENTS

| | | | |
|---|---|---|---|
| 2007/0018237 | A1 | 1/2007 | Kim et al. |
| 2009/0114991 | A1* | 5/2009 | Kim .................. H01L 27/10855 257/365 |
| 2010/0258858 | A1 | 10/2010 | Kim |
| 2011/0003459 | A1* | 1/2011 | Shin .................... H01L 29/4236 438/430 |
| 2015/0263113 | A1* | 9/2015 | Kim .................. H01L 27/10823 257/296 |

FOREIGN PATENT DOCUMENTS

| | | |
|---|---|---|
| CN | 103928404 A | 7/2014 |
| CN | 107680969 A | 2/2018 |
| GN | 1901201 A | 1/2007 |
| GN | 101315892 A | 12/2008 |

OTHER PUBLICATIONS

PCT International Preliminary Report on Patentability dated May 28, 2020, issued in related International Application No. PCT/CN2018/115267 (6 pages).

First Search dated Apr. 16, 2018, issued in related Chinese Application No. 201711116015.4 (1 page).

Second Office Action dated Jul. 13, 2018, issued in related Chinese Application No. 201711116015.4, with English machine translation (7 pages).

* cited by examiner

ASYMMETRIC FINFET IN MEMORY DEVICE, METHOD OF FABRICATING SAME AND SEMICONDUCTOR DEVICE

CROSS-REFERENCE TO RELATED APPLICATION

This application is a continuation application of International Patent Application No. PCT/CN2018/115267, filed on Nov. 13, 2018, which claims priority to China Patent Application No. 201711116015.4, filed with the China Patent Office on Nov. 13, 2017 and entitled "ASYMMETRIC FINFET IN MEMORY DEVICE, METHOD OF FABRICATING SAME AND SEMICONDUCTOR DEVICE." The above-referenced applications are incorporated herein by reference in their entirety.

TECHNICAL FIELD

The present invention relates to the field of semiconductor technology and, in particular, to an asymmetric fin field-effect transistor (FinFET) in a memory device, a method for fabricating the asymmetric FinFET and a semiconductor device.

BACKGROUND

Integrated circuits (ICs) have evolved from the early ones each integrating dozens of component devices to the modern ones each containing millions of components. The performance and complexity of modern ICs have far exceeded the earlier expectations. In order to further improve complexity and density (the number of component devices that can be accommodated within a certain chip area), the minimum feature size, also known as critical dimension (CD), of IC components has been shrinking ever since. Higher IC density means not only increased IC complexity and performance, but also a lower price for consumers. To further shrink the feature size of IC components is challenging because every process involved in IC fabrication has a limit. In other words, if a process is required to perform at a feature size smaller than its limit, then either the process or the component needs to be changed. In addition, traditional processes and materials often lag behind increasingly high demands of IC design.

Dynamic random access memories (DRAMs) are the most common system-level memories. Although the performance of DRAMs as semiconductor devices has experienced great enhancements, there is still a need for its further improvement. Conventionally, fin field-effect transistor (FinFET) DRAMs are commonly used, whose performance is, however, constrained by whether active areas on both sides of the fin meet certain height criteria.

SUMMARY OF THE INVENTION

It is an object of the present invention to provide an asymmetric memory fin field-effect transistor (FinFET) with better performance and a method for fabricating the FinFET.

To this end, the provided asymmetric FinFET in a memory device comprises:

a substrate having a plurality of active areas formed therein;

an isolation structure formed in the substrate and isolating the plurality of active areas, wherein the plurality of active areas are arranged in multiple rows; and a plurality of word lines formed in the substrate, the plurality of word lines crossing over the isolation structure and the active areas, wherein each of the active areas comprises a fin, a length of a first end of the fin on a first side of the active area and covered by the word line being different from a length of a second end of the fin on a second side of the active area and covered by the word line so as to reduce a current leakage. Each of the word lines crosses over several of the plurality of rows, and wherein in each of the crossed rows, the word line crosses over two adjacent active areas.

For each of the word lines, a bottom of a first portion of the word line between two active areas respectively located in two adjacent rows has a height difference of a with respect to a bottom of a second portion of the world line in the active area, and a bottom of a third portion of the word line between two active areas located in a same row has a height difference of b with respect to the bottom of the second portion of the world line in the active area, wherein $a \neq b$, and $|a-b| \geq 0.5*Min(a, b)$, wherein $Min(a, b)$ represents a or b, whichever is smaller, wherein if $a>b$, then 1 nm$\leq$a$\leq$500 nm and 0.5 nm$\leq$b$\leq$300 nm, wherein if $a<b$, then 0$<$a$\leq$300 nm and 0.5 nm$\leq$b$\leq$500 nm.

Optionally, in the asymmetric FinFET, the plurality of active areas are arranged in multiple rows extending parallel to one another, and wherein the active areas in each row are arranged along a direction that is oriented at an acute angle with respect to a longitudinal direction of the active area Optionally, in the asymmetric FinFET, each of the word lines may cross over several of the plurality of rows, wherein in each of these crossed rows, the word line crosses over two adjacent active areas.

Optionally, in the asymmetric FinFET, for each of the word lines, a bottom of a first portion of the word line between two active areas respectively located in adjacent rows has a height difference of a with respect to a bottom of a second portion of the world line in the active area, and a bottom of a third portion of the word line between two active areas located in a same row has a height difference of b with respect to the bottom of the second portion of the world line in the active area, where $a \neq b$.

Optionally, in the asymmetric FinFET, for each of the word lines, $|a-b|$ may be greater than or equal to $0.5*Min(a, b)$, where $Min(a, b)$ represents a or b, whichever is smaller.

Optionally, in the asymmetric FinFET, if $a>b$, then a may be greater than or equal to 1 nm and smaller than or equal to 500 nm, with 0.5 nm$\leq$b$\leq$300 nm.

Optionally, in the asymmetric FinFET, if $a<b$, then a may be greater than 0 and smaller than or equal to 300 nm, with 0.5 nm$\leq$b$\leq$500 nm.

Optionally, in the asymmetric FinFET, the isolation structures may comprise a first isolation material layer over side walls of the active areas, the first isolation material layer having a thickness ranging from 1 nm to 200 nm.

Optionally, in the asymmetric FinFET, the isolation structures may further comprise a second isolation material layer over the first isolation material layer. The first isolation material layer and the second isolation material have different etching rates, and the first isolation material layer is further formed on the bottom of the word lines located between two active areas respectively located in two adjacent rows, and on the bottom of the word lines located between two adjacent active areas in the same row, and wherein the second isolation material layer is formed on the bottom of the word lines located between two active areas respectively located in two adjacent rows.

Optionally, in the asymmetric FinFET, in a direction in which the word line extends, the active areas are spaced apart from one another at a first interval or at a second interval, the first interval being greater than the second interval, and wherein a top of the isolation structure in the first interval is higher than a top of the isolation structure in the second interval so that for each of the active areas, a depth of extension of a first bottom part of the world line covering the first side of the active area and corresponding to the first interval is smaller than a depth of extension of a second bottom part of the world line covering the second side of the active area and corresponding to the second interval.

Optionally, in the asymmetric FinFET, in a direction in which the word lines extend, the active areas may be spaced apart from one another at a first interval or at a second interval that is smaller than the first interval, wherein a top of the isolation structure in the first interval being lower than a top of the isolation structure in the second interval so that the for each of the active areas, a depth of extension of a first bottom part of the world line covering the first side of the active area and corresponding to the first interval is greater than a depth of extension of a second bottom part of the world line covering the second side of the active area and corresponding to the second interval.

The present invention also provides a method for fabricating an asymmetric fin field-effect transistor (FinFET) in a memory device, comprising:

providing a substrate;

forming an isolation structure in the substrate, the isolation structure defining and isolating a plurality of active areas, wherein the plurality of active areas are arrange in multiple rows; and forming a plurality of word lines in the substrate, the plurality of word lines crossing over the isolation structure and the active areas, wherein each of the active areas comprises a fin, a length of a first end of the fin on a first side of the active area and covered by the word line being different from a length of a second end of the fin on a second side of the active area and covered by the word line so as to reduce a current leakage. Each of the word lines crosses over several of the plurality of rows, and wherein in each of the crossed rows, the word line crosses over two adjacent active areas.

For each of the word line, a bottom of a first portion of the word line between two active areas respectively located in two adjacent rows has a height difference of a with respect to a bottom of a second portion of the world line in the active area, and a bottom of a third portion of the word line between two active areas located in a same row has a height difference of b with respect to the bottom of the second portion of the world line in the active area, wherein a≠b, and |a−b|≥0.5*Min(a, b), wherein Min(a, b) represents a or b, whichever is smaller, wherein if a>b, then 1 nm≤a≤500 nm and 0.5 nm≤b≤300 nm, wherein if a<b, then 0<a≤300 nm and 0.5 nm≤b≤500 nm.

Optionally, in the method, the formation of the isolation structures may comprise:

etching the substrate to form therein first insulating isolation trenches and second insulating isolation trenches to define and isolate multiple rows of active area mesas, the rows extending parallel to one another, the active areas in each row arranged along a direction that is oriented at an acute angle with respect to a longitudinal direction of the active area mesas, the active area mesas in each row being joined at bottoms, the first insulating isolation trenches spacing apart the active area mesas of the same rows, the second insulating isolation trenches separating the rows from one another;

forming a first isolation material layer over the first insulating isolation trenches and the second insulating isolation trenches, the first isolation material layer covering the active areas mesas and having a thickness that is smaller than a height of the active area mesas;

forming a second isolation material layer over the first isolation material layer, the first and second isolation material layers serving as a material layer for the isolation structure;

planarizing the material layer to form the isolation structure, the isolation structure having a top surface that is flush with a top surface of the active area mesas; and forming the active areas by doping the active area mesas.

Optionally, in the method, adjacent active area mesas in each row may be differently doped.

Optionally, in the method, the formation of the plurality of word lines in the substrate may comprise:

etching the first and second isolation material layers with an etchant having different etching rates for the first and second isolation material layers, thereby forming first word-line trenches between the active areas of adjacent rows and second word-line trenches between adjacent active areas in same rows;

etching the active areas to form third word-line trenches, with bottoms of the first word-line trenches and of the second word-line trenches serving as an etching mask, all the first word-line trenches, the second word-line trenches and the third word-line trenches serving as trenches to form the word lines, wherein a height difference from bottoms of the first word-line trenches to bottoms of the third word-line trenches is denoted as a, and a height difference from bottoms of the second word-line trenches to the bottoms of the third word-line trenches as b, there is a≠b; and forming the plurality of word lines in the first word-line trenches, the second word-line trenches and the third word-line trenches.

Optionally, in the method, |a−b| may be greater than or equal to 0.5*Min(a, b), where Min(a, b) represents a or b, whichever is smaller.

Optionally, in the method, if a>b, then a may be greater than or equal to 1 nm and smaller than or equal to 500 nm, with 0.5 nm≤b≤300 nm. If a<b, then a may be greater than 0 and smaller than or equal to 300 nm, with 0.5 nm≤b≤500 nm.

The present invention also provides a semiconductor device, comprising:

a substrate;

a plurality of array structures formed in the substrate, wherein the plurality of array structures are arranged in multiple rows;

a surrounding structure formed in the substrate and isolating both outside and inside of the array structures; and a plurality of penetrating structures formed in the substrate and crossing over the array structures and portions of the surrounding structure among the array structures, wherein for each of the array structures crossed by the corresponding penetrating structure, a length of a first side portion of the array structure covered by a bottom part of the penetrating structure is different from a length of a second side portion of the array structure covered by the bottom part of the penetrating structure. Each of the penetrating structures crosses over several of the plurality of rows, and wherein in each of the crossed rows, the penetrating structure crosses over two adjacent array structures.

For each of the penetrating structures, a bottom of a first portion of the penetrating structure between two array structures respectively located in two adjacent rows has a height difference of a with respect to a bottom of a second portion of the penetrating structure in the array structure, and a bottom of a third portion of the penetrating structure between two array structures located in a same row has a height difference of b with respect to the bottom of the second portion of the penetrating structure in the array structure, wherein a≠b, and |a−b|≥0.5*Min(a, b), wherein Min(a, b) represents a or b, whichever is smaller, wherein if a>b, then 1 nm≤a≤500 nm and 0.5 nm≤b≤300 nm, wherein if a≤b, then 0<a≤300 nm and 0.5 nm≤b≤500 nm.

In the asymmetric FinFET and the method provided in the present invention, each of the active areas comprises a fin, a length of a first end of the fin on a first side of the active area and covered by the word line being different from a length of a second end of the fin on a second side of the active area and covered by the word line, the present invention allows a reduced process difficulty. In addition, these different depths of extensions of the word lines on different sides of the fin can induce a weaker unidirectional electric field which suffers from much less current leakage, compared to a bidirectional electric field created in conventional word lines with equal depths of extensions.

LIST OF REFERENCE NUMERALS IN THE DRAWINGS

10, 20 isolation structure
100 substrate
11, 21, 101*a*, 101*b*, 101 active area
101' active area mesa
12 symmetric fin gate structure
22 asymmetric fin gate structure
1021 first insulating isolation trench
1022 second insulating isolation trench
103 first isolation material layer
104 second isolation material layer
105 first word-line trench
106 second word-line trench
107 third word-line trench
120 word line
S portion right facing each other

DETAILED DESCRIPTION

The asymmetric FinFET in a memory device, the method for fabricating the FinFET and the semiconductor device provided in the present invention will be described below in greater detail with reference to the accompanying schematics, which represent preferred embodiments of the invention. It is to be appreciated that those skilled in the art can make changes to the invention disclosed herein while still obtaining the beneficial results thereof. Therefore, the following description shall be construed as being intended to be widely known by those skilled in the art rather than as limiting the invention.

The present invention will be further described in the following paragraphs by way of example with reference to the accompanying drawings. Features and advantages of the invention will be more apparent from the following detailed description, and from the appended claims. Note that the accompanying drawings are provided in a very simplified form not necessarily presented to scale, with the only intention of facilitating convenience and clarity in explaining the embodiments.

It will be appreciated that any layer (or film), region, pattern or structure described hereinafter as being "over" a substrate, another layer (or film), another region, a weld pad and/or another pattern may be disposed directly on the another layer or the substrate optionally with one or more layers inserted therebetween. In addition, it will be appreciated that any layer described hereinafter as being "under" another layer may be disposed directly under the another layer optionally with one or more intervening layers inserted therebetween. Furthermore, reference can be made to the appended figures to ascertain how various layers are disposed "over" or "under" with respect to one another.

Figure 1:
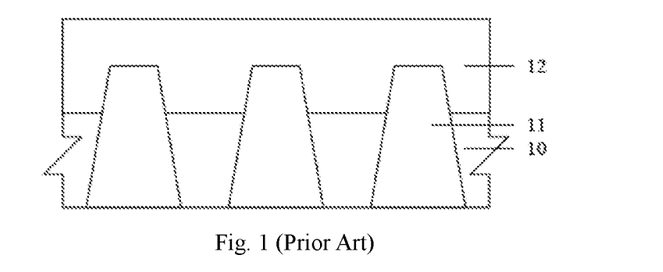
FIG. 1 is a structural schematic of a memory transistor.

FIG. 1 is a structural schematic of a memory transistor. As shown in FIG. 1, the memory transistor includes a substrate containing active areas 11 that are separated from one another by an isolation structure 10 between them. A symmetric fin gate structure 12 crosses over the fins 11. In the device of FIG. 1, the active areas 11 may be uniformly distributed.

Figure 2:
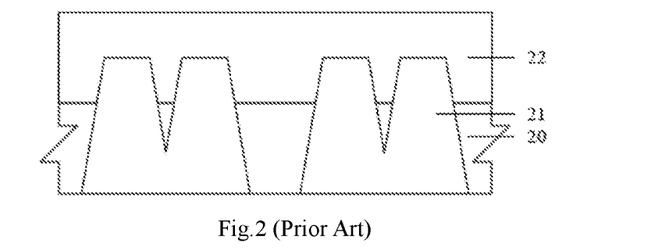
FIG. 2 is a structural schematic of another memory transistor.

FIG. 2 is a structural schematic of another memory transistor. As shown in FIG. 2, the memory transistor includes a substrate containing active areas 21 that are separated from one another by an isolation structure 20 between them. An asymmetric fin gate structure 22 crosses over the active areas 21. In the device of FIG. 2, the active areas 21 may be non-uniformly distributed.

As can be seen from FIGS. 1 and 2, in both of those memory transistors, for each active area 11 or 21, the isolation structure 10 or 20 has a same height (e.g., relative to a top surface of the active area) on both sides of the active area 11 or 21. That is, bottom portions of the symmetric or asymmetric fin gate structure 12 or 22 on both sides of the active area 11 or 21 are equally high, meaning that bottom portions of the fin gate structure 12 or 22 cover, with equal lengths, on respective sides of the active area. It will be appreciated that the height of the symmetric or asymmetric fin gate structure 12, 22 is eventually determined by the ability of the used etching process. However, in practice, it is very difficult for the etching process to satisfy such a requirement, and in the resulting device, there are always small variations in the height of the isolation structure among the active areas 11, 21, although the isolation structure with such height variations is still considered to have a uniform height. These height variations will lead to corresponding variations in the symmetric or asymmetric fin gate structures 12, 22. However, with the continuing miniaturization of component devices, such variations are becoming increasingly considerable and detrimental to the performance of the component devices.

After experiments and analysis following an idea that breaks the convention, the inventors surprisingly found that better effects could be obtained by further enlarging the variations in the height of the isolation structure so that ends of the fin on opposing sides of the active areas and covered by the word lines have unequal lengths.

Figure 3:
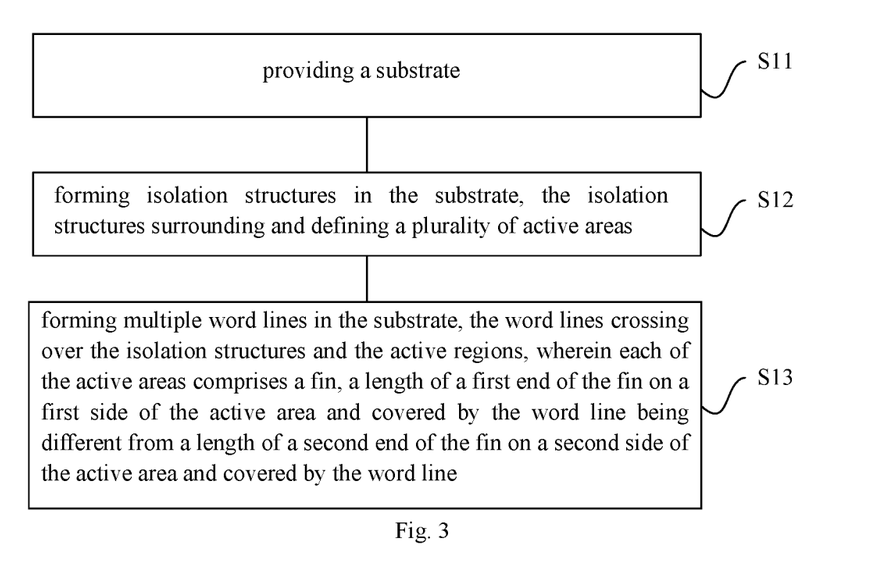
FIG. 3 is a flowchart schematically illustrating a method for fabricating an asymmetric FinFET in a memory device according to one embodiment of the present invention.

Based on the above findings, the present invention provides an asymmetric FinFET in a memory device in order to ameliorate the aforementioned deficiencies. Specifically, reference is made to FIG. 3, a flowchart schematically illustrating a method for fabricating the asymmetric FinFET according to one embodiment of the present invention. The method includes the steps of:

S11: providing a substrate;

S12: forming an isolation structure in the substrate, the isolation structure defining and isolating a plurality of active areas; and S13: forming a plurality of word lines in the substrate, the word lines crossing over the isolation structure and the active areas, wherein each of the active areas comprises a fin, a length of a first end of the fin on a first side of the active area and covered by the word line being different from a length of a second end of the fin on a second side of the active area and covered by the word line.

Figure 4:
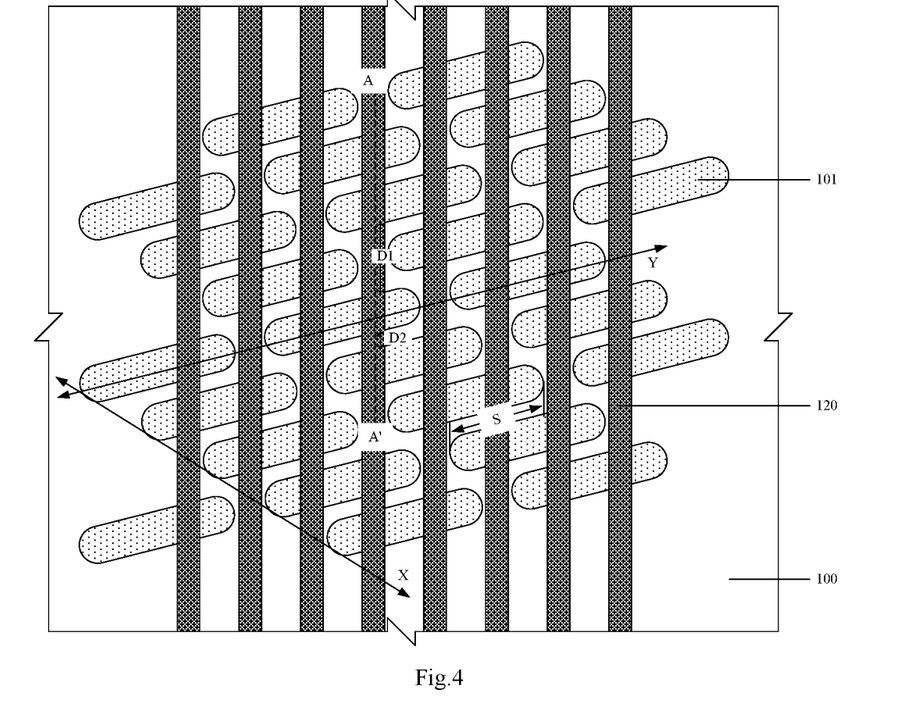
FIG. 4 is a schematic top view of an asymmetric FinFET in a memory device according to one embodiment of the present invention.

FIGS. 4 to 14 are structural schematics showing steps in one embodiment of the method for fabricating the asymmetric FinFET according to the present invention. In these figures, FIG. 4 is a schematic top view of the resulted asymmetric FinFET of the present invention according to the embodiment, while FIGS. 5 to 14 are schematic cross-sectional views of structures resulting from the respective steps in the embodiment taken along line A-A' in FIG. 4.

Figure 5:
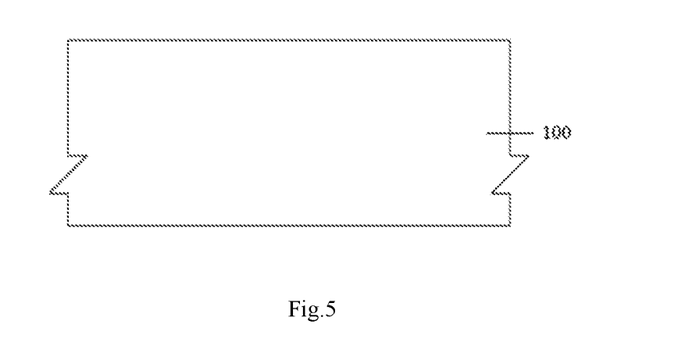
FIG. 5 is a schematic cross-sectional view of a structure resulting from the provision of a substrate in a method for fabricating the asymmetric FinFET according to one embodiment of the present invention taken along line A-A' in FIG. 4.

As shown in FIG. 5, in step S11, a substrate 100 is provided. Specifically, the substrate 100 may be an undoped monocrystalline silicon substrate, a doped monocrystalline silicon substrate, a silicon-on-insulator (SOI) substrate or the like. As one exemplary implementation, the substrate 100 may be a monocrystalline silicon substrate. In the substrate 100, there may already be well-known structures such as buried layers (not shown), while the present invention is not so limited.

Figure 6:
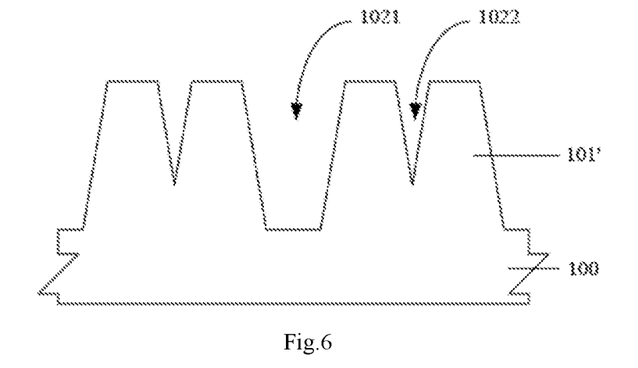
FIG. 6 is a schematic cross-sectional view of a structure resulting from the formation of active area mesas in the method for fabricating the asymmetric FinFET according to the embodiment of the present invention taken along line A-A' in FIG. 4.

Reference is then made to FIG. 6, a schematic cross-sectional view showing a structure resulting from the formation of an active area pattern in the method for fabricating the asymmetric FinFET according to the embodiment of the present invention.

In step S12, an isolation structure that surrounds and defines the plurality of active areas 101 is formed in the substrate 100. Specifically, this step can be accomplished by photolithography and etching processes. As shown in FIGS. 4 and 6, the substrate 100 is etched to form therein first insulating isolation trenches 1021 and second insulating isolation trenches 1022, which together surround and define multiple rows of active area mesas 101' so that each of the rows extends in an X direction oriented at an acute angle with respect to a longitudinal Y direction of the active area mesas 101' in the row (i.e., the two directions are not perpendicular to each other). These rows extend parallel to one another, and the active area mesas 101' in each row are joined at their bottoms. The first insulating isolation trenches 1021 are intra-row trenches spacing apart the active area mesas 101' within the rows, while the second insulating isolation trenches 1022 are inter-row trenches separating different rows from one another.

The first insulating isolation trenches 1021 and the second insulating isolation trenches 1022 correspond to different portions of the active area pattern and hence are different from each other. For example, adjacent active area mesas 101' in the same row have portions facing each other indicated by S in FIG. 4. The second insulating isolation trenches 1022 are formed corresponding to these facing portions and have a height from a bottom thereof to a top surface of the active area mesas 101' smaller than a height of the first insulating isolation trenches 1021, from a bottom thereof to a top surface of the active area mesas 101', which are formed outside the facing portions. This can facilitate the subsequent formation of the isolation structure, and the subsequently formed word lines will have asymmetric portions on different sides of the active areas, i.e., asymmetric fins.

In one embodiment, the active area mesas 101' in each row are distributed equidistantly, i.e., with a constant pitch, with their centers all situated on a single line. In addition, adjacent rows also have a constant pitch. As such, the active area mesas 101' are distributed uniformly.

The centers of corresponding active area mesas 101' in the respective rows may be either collinear or not. In a non-collinear case, when the center points projected along the X direction in which the rows extend onto a plane, the projections of these center points may be staggered by a certain distance (e.g., equal to a width of one word line). On this basis, the staggering amount may be flexibly adjusted according to the actual process and product requirements.

For example, in the embodiment shown in FIG. 4, the centers of the active area mesas 101' in each row are collinear.

In one embodiment, the active area mesa 101' may have a upward tapered cross-section, i.e. narrow at top and wide at bottom. This is shown in FIG. 6, wherein the two active area mesas 101' on the left are in the same row and joined (partially) at their bottoms, and similarly, the two active area mesas 101' on the right are also in the same row and joined (partially) at their bottoms. In addition, the second insulating isolation trenches 1022 are narrow and shallow, while the first insulating isolation trench 1021 that spans active area mesas 101' of different rows is wide and deep.

The upward tapered shapes of the active area mesas 101' can facilitate the subsequent formation of the isolation structure.

It will be appreciated that each of the active area mesas 101' has the same shape and hence the same parameters such as top and bottom widths, height, etc.

Figure 7:
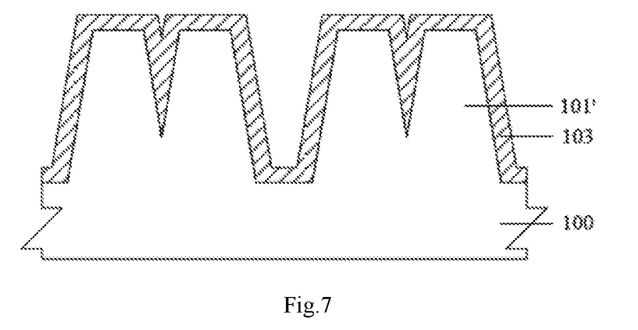
FIG. 7 is a schematic cross-sectional view of a structure resulting from the formation of a first isolation material layer in the method for fabricating the asymmetric FinFET according to the embodiment of the present invention taken along line A-A' in FIG. 4.

Reference is then made to FIG. 7, a schematic cross-sectional view showing a structure resulting from the formation of a first isolation material layer in the method for fabricating the asymmetric FinFET according to the embodiment of the present invention. The first isolation material layer 103 covers all interior surfaces of the first insulating isolation trenches 1021 and of the second insulating isolation trenches 1022 and the top surfaces of the active area mesas 101', and has a thickness that is smaller than the height of the active area mesas 101'.

In one embodiment, the thickness of the first isolation material layer 103 may range from 1 nm to 200 nm.

In one embodiment, the first isolation material layer 103 may be selected as a film of a silicon-based material such as silicon oxide ($SiO_x$), silicon nitride ($Si_3N_x$), silicon oxynitride (SiON), etc. or a high-k material such as hafnium (Hf), zirconium (Zr), aluminum oxide ($AlO_x$), etc. At least one or a combination of several of the materials enumerated hereinabove and even optionally other materials may be selected based on the actual process requirements, and the present invention is not limited to the enumerated materials.

For example, the first isolation material layer 103 may be formed by chemical vapor deposition (CVD).

As can be seen from FIG. 7, the smaller second insulating isolation trenches 1022 are almost completely filled by the first isolation material layer 103, while the greater first insulating isolation trenches 1021 are only lined by the first isolation material layer 103 at the side and bottom surfaces and still have rather large free interior spaces.

Figure 8:
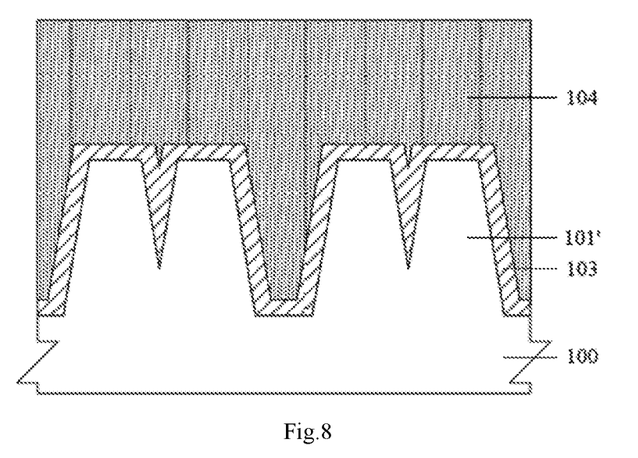
FIG. 8 is a schematic cross-sectional view of a structure resulting from the formation of a second isolation material layer in the method for fabricating the asymmetric FinFET according to the embodiment of the present invention taken along line A-A' in FIG. 4.

Reference is then made to FIG. 8, a schematic cross-sectional view showing a structure resulting from the formation of a second isolation material layer in the method for fabricating the asymmetric FinFET according to the embodiment of the present invention. The second isolation material layer 104 is formed over the first isolation material layer 103. The first and second isolation material layers together provide a material layer for the subsequently-formed isolation structure.

In one embodiment, the second isolation material layer 104 may be rather thick, for example, with a thickness of 500-10000 nm or the like. It will be appreciated that a top surface of the second isolation material layer 104 is higher than the tops of the active area mesas 101', and portions of the second isolation material layer overlying the active area mesas 101' will be removed subsequently. Therefore, in practice, its thickness may be selected flexibly.

In one embodiment, the second isolation material layer 104 may be selected as a film of a silicon-based material such as silicon oxide ($SiO_x$), silicon nitride ($Si_3N_x$), silicon oxynitride (SiON), etc.

As an example, the second isolation material layer 104 may be formed by CVD.

As another example, the second isolation material layer 104 may be formed by a tetraethyl orthosilicate (TEOS) process, which may either be a low-pressure TEOS (LP-TEOS) process or a plasma enhanced TEOS (PE-TEOS) process.

As still another example, the second isolation material layer 104 may be formed by a spin-on-deposition (SOD) process.

Figure 9:
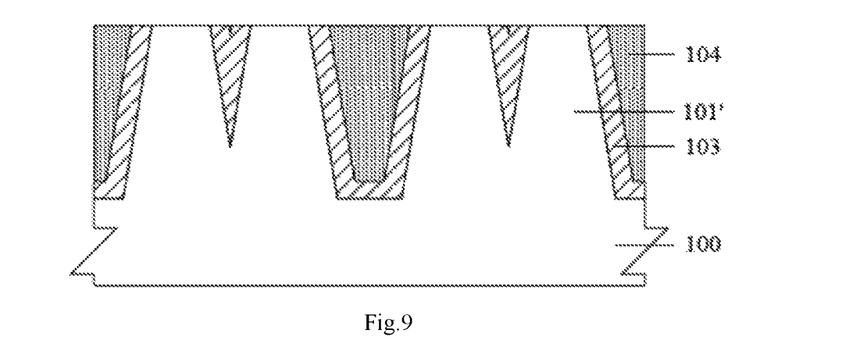
FIG. 9 is a schematic cross-sectional view of a structure resulting from the formation of an isolation structure in the method for fabricating the asymmetric FinFET according to the embodiment of the present invention taken along line A-A' in FIG. 4.

Reference is then made to FIG. 9, a schematic cross-sectional view showing a structure resulting from the formation of the isolation structure in the method for fabrication the asymmetric FinFET according to the embodiment of the present invention. The isolation structure may be obtained by planarizing the aforementioned two material layers until their top surfaces are flush with top surface of the active area mesas 101'. The planarization may, for example, be accomplished with mechanical polishing process (CMP).

Figure 10:
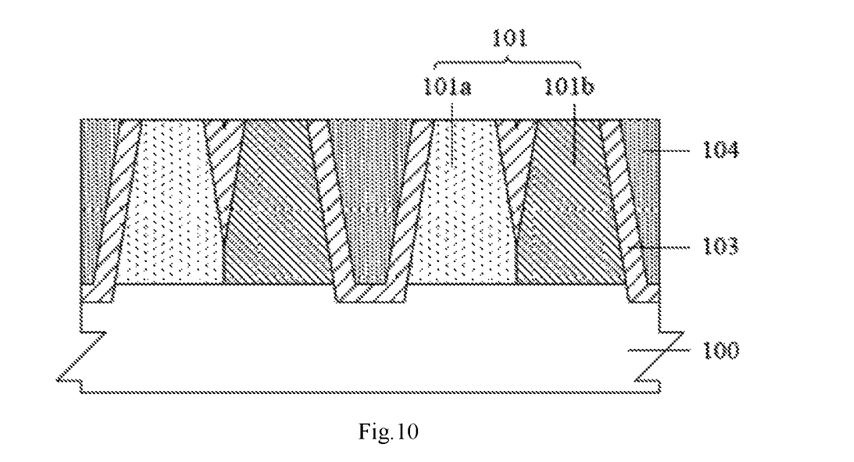
FIG. 10 is a schematic cross-sectional view of a structure resulting from the formation of active areas in the method for fabricating the asymmetric FinFET according to the embodiment of the present invention taken along line A-A' in FIG. 4.

Reference is then made to FIG. 10, a schematic cross-sectional view showing a structure resulting from the formation of the active areas in the method for fabrication the asymmetric FinFET according to the embodiment of the present invention. The active areas 101 are formed by doping the active area mesas.

In one embodiment, adjacent active area mesas in each row, which are joined together at their bottoms, may be differently doped, for example, respectively n- and p-doped. As shown in FIG. 10, the active area 101a and active area 101b are differently doped. In this way, in addition to the isolation structures, conduction between adjacent active areas 101 that are joined together at the bottoms can be further prevented.

In step S13, a plurality of word lines are formed in the substrate. The word lines cross over the isolation structure and the active areas. Each of the active areas comprises a fin in the area covering the word line, a length of a first end of the fin on a first side of the active area and covered by the word line being different from a length of a second end of the fin on a second side of the active area and covered by the word line so as to reduce a current leakage.

Step S13 may essentially include: reducing thickness of portions of the isolation structure (where the word lines are to be formed) by etching the first isolation material layer 103 and the second isolation material layer 104 with an etchant having different etching rates for these two isolation material layers, thereby forming first word-line trenches 105 and second word-line trenches 106. The first word-line trenches 105 are inter-row trenches between adjacent rows, while the second word-line trenches 106 are intra-row trenches between adjacent active areas 101 in the same rows.

Figure 11:
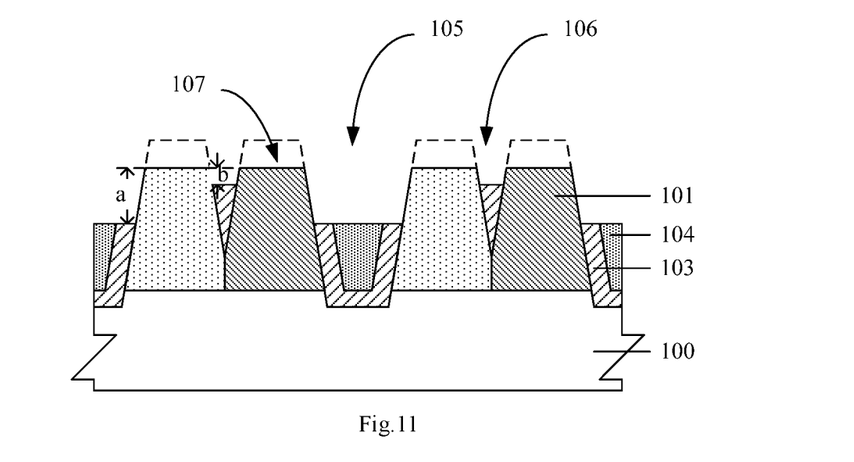
FIG. 11 is a schematic cross-sectional view of a structure resulting from the formation of first word-line trenches, second word-line trenches and third word-line trenches in the method for fabricating the asymmetric FinFET according to the embodiment of the present invention taken along line A-A' in FIG. 4.

Reference is then made to FIG. 11, a schematic cross-sectional view showing a structure resulting from the formation of the first word-line trenches, the second word-line trenches and third word-line trenches in the method for fabricating the asymmetric FinFET according to the embodiment of the present invention. In one embodiment, an etchant whose etching rate for the second isolation material layer 104 is higher than its etching rate for the first isolation material layer 103 may be selected. As the portions where the second word-line trenches 106 to be formed are almost completely constituted by the first isolation material layer 103, they are etched more slowly and are thus less removed, compared to the portions where the first word-line trenches 105 to be formed which are mainly constituted by the second isolation material layer 104. As a result, the bottoms of the first word-line trenches 105 are lower than those of the second word-line trenches 106, i.e., farther from the top surface of the active areas 101.

With continued reference to FIG. 11, the active areas 101 are then etched to form the third word-line trenches 107, with the bottoms of the first word-line trenches 105 and of the second word-line trenches 106 serving as an etching mask. All the first word-line trenches 105, the second word-line trenches 106 and the third word-line trenches 107 are formed for the formation of the word lines. It will be appreciated that the bottoms of the third word-line trenches 107 are higher than the bottoms of the active areas 101. More specifically, the bottoms of the third word-line trenches 107 are higher than the bottoms of the second word-line trenches 106.

As can be seen from FIG. 11, if a height different from the bottoms of the first word-line trenches 105 to the bottoms of the third word-line trenches 107 is denoted as a, and a height different from the bottoms of the second word-line trenches 106 to the bottoms of the third word-line trenches 107 as b, there is a≠b.

Further, in the embodiment of FIG. 11, there is a>b.

More specifically, $|a-b| \geq 0.5*Min(a, b)$, where Min(a, b) represents a or b, whichever is smaller.

Furthermore, 1 nm≤a≤500 nm, and 0.5 nm≤b≤300 nm.

Figure 12:
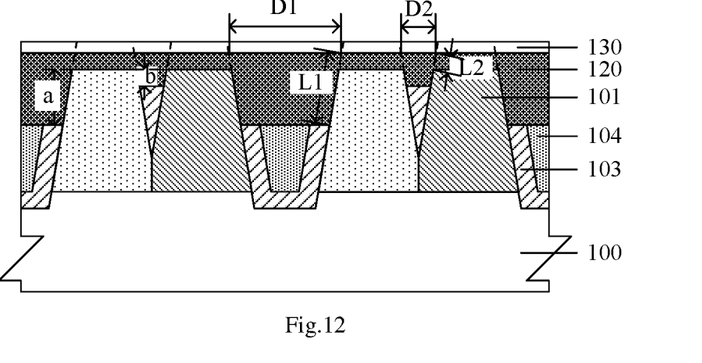
FIG. 12 is a schematic cross-sectional view of a structure resulting from the formation of word lines in the method for fabricating the asymmetric FinFET according to the embodiment of the present invention taken along line A-A' in FIG. 4.

Reference is then made to FIGS. 11 to 12, in which FIG. 12 is a schematic cross-sectional view showing a structure resulting from the formation of the word lines in the method for fabricating the asymmetric FinFET according to the embodiment of the present invention. The word lines 120 are formed in the first word-line trenches 105, the second word-line trenches 106 and the third word-line trenches 107 so that their top surfaces are lower than the top surfaces of the active areas 101. Additionally, the plurality of the word lines 120 may be arranged as shown in FIG. 4.

Furthermore, a dielectric layer 130 may be formed on the word lines 120 so that its top surface is flush with the top surfaces of the active areas 101.

As shown in FIG. 12, each of the active areas comprises a fin, a length L1 of a first end of the fin on a first side of the active area 101 and covered by the word line 120 being different from a length L2 of a second end of the fin on a second side of the active area 101 and covered by the word line 120. That is, these fins are not symmetric (i.e., not identical), i.e., asymmetric fins.

For example, in the direction in which the word lines 120 extend, the active areas 101 may be spaced apart from one another at a first interval D1 and a second interval D2 that is smaller than the first interval DE Moreover, tops of portions of the isolation structure corresponding to the first intervals D1 are lower than tops of the portions of the isolation structure corresponding to the second intervals D2. As a result, for each of the active areas 101, a length of extension of a first bottom part of the world line covering one side of the active area and corresponding to the first interval is smaller than a length of extension of a second bottom part of the world line covering the other side of the active area and corresponding to the second interval.

Figure 13:
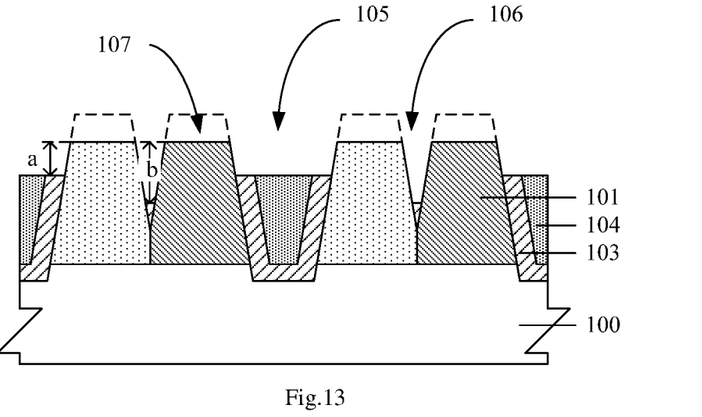
FIG. 13 is a schematic cross-sectional view of a structure resulting from the formation of first word-line trenches, second word-line trenches and third word-line trenches in an alternative embodiment of the method for fabricating the asymmetric FinFET according to the present invention taken along line A-A' in FIG. 4.

Reference is now made to FIG. 13, a schematic cross-sectional view of a structure resulting from the formation of first word-line trenches, second word-line trenches and third word-line trenches in an alternative embodiment of the method for fabricating the asymmetric FinFET according to the present invention taken along line A-A' in FIG. 4. In one embodiment, an etchant whose etching rate for the first isolation material layer 103 is higher than its etching rate for the second isolation material layer 104 may be selected. As the portions where the second word-line trenches 106 to be formed are almost completely constituted by the first isolation material layer 103, they are etched faster and are thus more removed, compared to the portions where the first word-line trenches 105 to be formed which are mainly constituted by the second isolation material layer 104. As a result, the bottoms of the second word-line trenches 106 are lower than those of the first word-line trenches 105, i.e., farther from the top surfaces of the active areas 101.

With continued reference to FIG. 13, the active areas 101 are then etched to form the third word-line trenches 107, with the bottoms of the first word-line trenches 105 and of the second word-line trenches 106 serving as an etching mask. All the first word-line trenches 105, the second word-line trenches 106 and the third word-line trenches 107 are formed for the formation of the word lines. It will be appreciated that the bottoms of the third word-line trenches 107 are higher than those of the active areas 101. More specifically, the bottoms of the third word-line trenches 107 are higher than those of the second word-line trenches 106.

As can be seen from FIG. 13, if the vertical distance from the bottoms of the first word-line trenches 105 to the bottoms of the third word-line trenches 107 is denoted as a, and the vertical distance from the bottoms of the second word-line trenches 106 to the bottoms of the third word-line trenches 107 as b, then a≠b.

Further, in the implementation of FIG. 11, a<b.

More specifically, $|a-b| \geq 0.5*Min(a, b)$, where Min(a, b) represents a or b, whichever is smaller.

Furthermore, 0<a≤300 nm, and 0.5 nm≤b≤500 nm.

Figure 14:
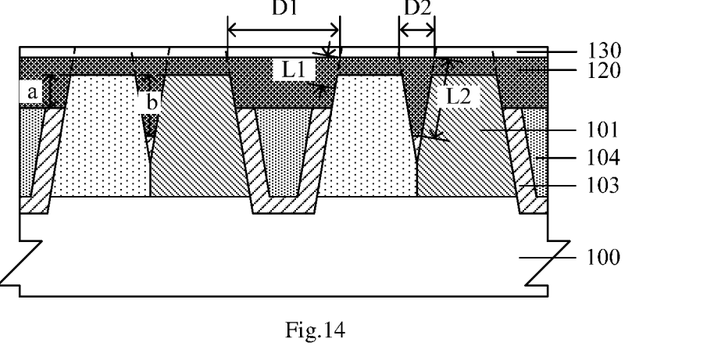
FIG. 14 is a schematic cross-sectional view of a structure resulting from the formation of word lines in the alternative embodiment of the method for fabricating the asymmetric FinFET according to the present invention taken along line A-A' in FIG. 4.

Reference is then made to FIGS. 13 to 14, in which FIG. 14 is a schematic cross-sectional view showing a structure resulting from the formation of the word lines in the alternative embodiment of the method for fabricating the asymmetric FinFET according to the present invention. The word lines 120 are formed in the first word-line trenches 105, the second word-line trenches 106 and the third word-line trenches 107 so that their top surfaces are lower than the top surfaces of the active areas 101. Additionally, the plurality of the word lines 120 may be arranged as shown in FIG. 4.

Furthermore, a dielectric layer 130 may be formed on the word lines 120 so that its top surface is flush with the top surfaces of the active areas 101.

As shown in FIG. 14, each of the active areas comprises a fin, a length L1 of a first end of the fin on a first side of the active area 101 and covered by the word line 120 being different from a length L2 of a second end of the fin on a second side of the active area 101 and covered by the word line 120. That is, these fins are not symmetric (i.e., not identical), i.e., asymmetric fins.

For example, in the direction in which the word lines 120 extend, the active areas 101 may be spaced apart from one another at a first interval D1 and a second interval D2 that is smaller than the first interval DE Moreover, tops of portions of the isolation structure corresponding to the first intervals D1 are higher than tops of portions of the isolation structure corresponding to the second intervals D2. As a result, for each of the active regions 101, a length L1 covered by a corresponding one of the word lines 120 on its side corresponding to the first interval D1 is smaller than a length L2 covered by the word line 120 on the side corresponding to the second interval D2.

As apparent from the above discussion, according to the present invention, the word lines cover different lengths of the active areas on different sides thereof. That is, on the opposing sides of the active areas, the word lines have different distances from their bottoms to the top surfaces of the active areas. Therefore, the present invention can avoid having to pursue height consistency, thus lowering process difficulty and allow easier fabrication. Moreover, as the bottoms of the word lines themselves are not consistent in height, variations in height introduced during the fabrication (e.g., formation of trenches by etching) would overall have a trivial impact on the word lines and hence on the performance of the resulting device. Further, as each of the active areas comprises a fin, a length of a first end of the fin on a first side of the active area and covered by the word line being different from a length of a second end of the fin on a second side of the active area and covered by the word line, weaker unidirectional electric fields can be induced, which suffers from much less current leakage, compared to bidirectional electric fields created in word lines with equally long fin end portions.

After that, subsequent processes, for example, those for forming bit lines, may be carried out according to practical needs. Since such processes are conventional processes, they will not be further detailed herein for the sake of simplicity.

With reference to FIGS. 3 to 14, the resulting asymmetric FinFET of the present invention includes:

a substrate 100, in which the plurality of active areas 101 are formed;

an isolation structure formed in the substrate 100, the isolation structure defining and surrounding the active areas 101; and the plurality of word lines 120 formed in the substrate 100, the word lines 120 crossing over the isolation structure and the active areas 101, wherein each of the active areas comprises a fin, a length of a first end of the fin on a first side of the active area and covered by the word line being different from a length of a second end of the fin on a second side of the active area and covered by the word line so as to reduce a current leakage.

In one embodiment, the plurality of active areas 101 may be arranged in a plurality of rows extending parallel to one another in an X direction oriented at an acute angle with respect to a longitudinal Y direction of the active areas.

Further, the active areas 101 in each row may be distributed equidistantly and oriented in the same direction, with their centers all situated on a single line. As such, the active areas 101 in each row are uniformly distributed.

The centers of corresponding active areas 101 in the respective rows may be either collinear or not. In the latter case, when the center points are projected along the direction in which the rows extend onto a plane, the projections of these center points are alternately staggered by a certain distance (e.g., equal to the width of one word line). On this basis, the staggering amount may be flexibly adjusted according to the actual process and product requirements.

In one embodiment, the active areas 101 may be all upward tapered, wherein the active areas 101 in each row are joined (partially) at their bottoms, and active areas 101 in different rows are not in contact with each other. In this case, as shown in FIG. 10, the two active areas 101 on the left are in the same row and joined (partially) at their bottoms, and similarly, the two active areas 101' on the right are also in the same row and joined (partially) at their bottoms.

In one embodiment, the isolation structure may comprise a first isolation material layer 103 over side faces of the active areas 101, the first isolation material layer having a thickness ranging from 1 nm to 200 nm.

In one embodiment, the first isolation material layer 103 may be selected as a film of a silicon-based material such as silicon oxide ($SiO_x$), silicon nitride ($Si_3N_x$), silicon oxynitride (SiON), etc. or a high-k material such as hafnium (Hf), zirconium (Zr), aluminum oxide ($AlO_x$), etc. At least one or a combination of several of the materials enumerated hereinabove and even optionally other materials may be selected based on the actual process requirements, and the present invention is not limited to the enumerated materials.

In one embodiment, the isolation structure may further comprise a second isolation material layer 104 over the first isolation material layer 103. Specifically, the second isolation material layer 104 may overlie parts of the first isolation material layer 103.

In one embodiment, the second isolation material layer 104 may be selected as a film of a silicon-based material such as silicon oxide ($SiO_x$), silicon nitride ($Si_3N_x$), silicon oxynitride (SiON), etc.

Each of the word lines 120 may cross over several of the plurality of rows of active areas 101 and over portions of the isolation structure, wherein in each of these crossed rows, it crosses over two adjacent active areas 101.

For each of the word lines 120, a bottom of a first portion of the word line 120 between two active areas 101 respectively located in adjacent rows has a height difference of a with respect to a bottom of a second portion of the world line in the active area 101, and a bottom of a third portion of the word line between two active areas 101 located in a same row has a height difference of b with respect to the bottom of the second portion of the world line 120 in the active area, then a may not be equal to b.

In one embodiment, a may be greater than b.

More specifically, |a−b| may be greater than or equal to 0.5*Min(a, b).

Further, if a>b, then 1 nm≤a≤500 nm, with 0.5 nm≤b≤300 nm. If a<b, then 0<a≤300 nm, with 0.5 nm≤b≤500 nm.

Each of the active areas comprises a fin, a length L1 of a first end of the fin on a first side of the active area 101 and covered by the word line 120 being different from a length L2 of a second end of the fin on a second side of the active area 101 and covered by the word line 120. That is, these fins are not symmetric (i.e., not identical), i.e., asymmetric fins.

For example, in the direction in which the word lines 120 extend, the active areas 101 may be spaced apart from one another at a first interval D1 or at a second interval D2 that is smaller than the first interval D1, with the top of portions of the isolation structure corresponding to the first intervals D1 being lower than the top of portions of the isolation structure corresponding to the second intervals D2, so that for each of the active areas, a depth of extension L1 of a first bottom part of the world line 120 covering the first side of the active area 101 and corresponding to the first interval D1 is greater than a depth of extension L2 of a second bottom part of the world line 120 covering the second side of the active area 101 and corresponding to the second interval D2.

As another example, in the direction in which the word lines 120 extend, the active areas 101 may be spaced apart from one another at a first interval D1 or at a second interval D2 that is smaller than the first interval D1, with the top of portions of the isolation structure corresponding to the first intervals D1 being higher than the top of portions of the isolation structure corresponding to the second intervals D2, so that for each of the active areas, a depth of extension L1 of a first bottom part of the world line 120 covering the first side of the active area 101 and corresponding to the first interval D1 is smaller than a depth of extension L2 of a second bottom part of the world line 120 covering the second side of the active area 101 and corresponding to the second interval D2.

Figure 15:
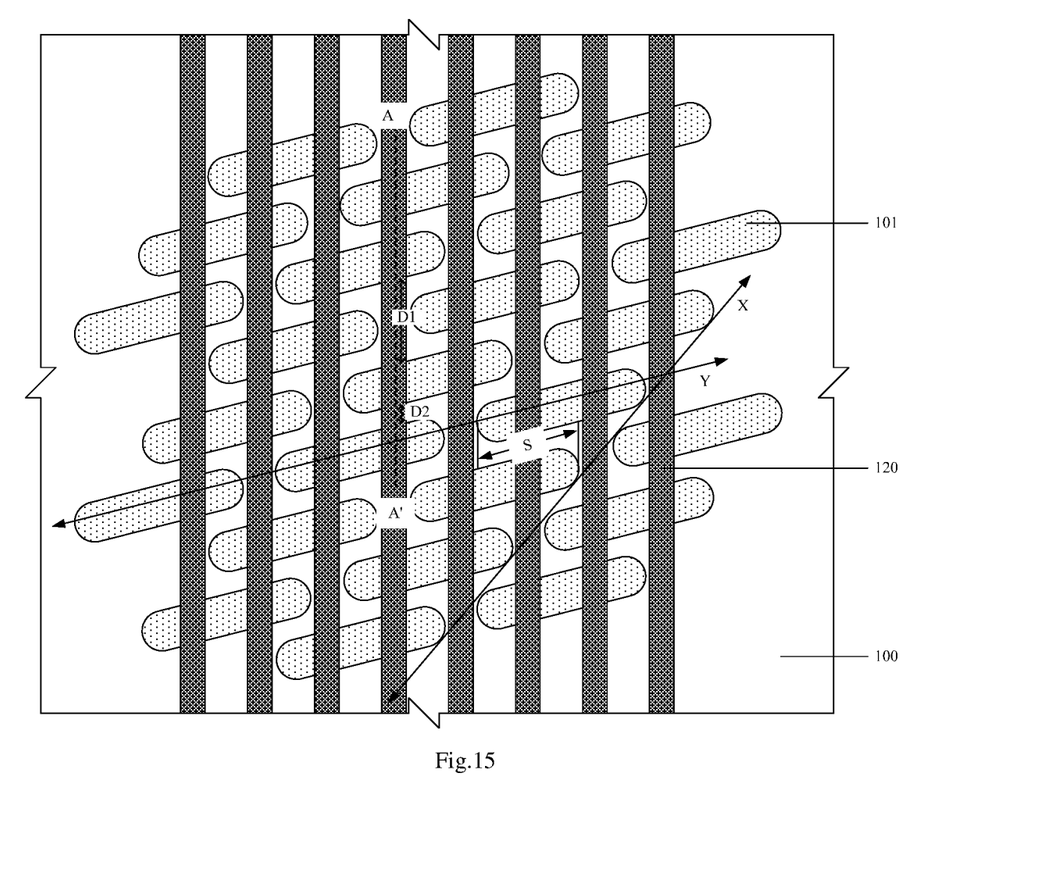
FIG. 15 is a schematic top view of an asymmetric FinFET in a memory device according to another embodiment of the present invention.

FIG. 15 shows an asymmetric FinFET in a memory device according to another embodiment of the present invention, which has an alternative layout.

The embodiment of FIG. 15 differs from the embodiment of FIG. 4 essentially in their different arrangement of active areas. Specifically, with the same longitudinal Y direction of the active areas, the rows of active areas extend in a different X direction in these two layouts. Nevertheless, the cross-sectional views of the structures taken along line A-A' shown in FIGS. 5 to 14 also apply to the layout of FIG. 15, so the reference numerals in FIG. 4 are also marked in FIG. 15. Based on the above teachings, those skilled in the art can easily know details in the structure and fabrication of the asymmetric FinFET of FIG. 15. Therefore, it will not be further described herein in order to avoid redundant description.

Based on the above, the present invention also provides a semiconductor device, including:

a substrate;
a plurality of array structures formed in the substrate;
a surrounding structure formed in the substrate and isolating both outside and inside of the array structures; and
a plurality of penetrating structures formed in the substrate and crossing over the array structures and portions of the surrounding structure among the array structures, wherein for each of the array structures crossed by the corresponding penetrating structure, a length of a first side portion of the array structure covered by a bottom part of the penetrating structure is different from a length of a second side portion of the array structure covered by the bottom part of the penetrating structure.

In summary, in the asymmetric FinFET and the method provided in the present invention, as the vertical distances from the bottoms of the word lines to the top surfaces of the active areas are different from each other on opposing sides of the active areas, the present invention allows reduced process difficulty. In addition, these different vertical distances of the word lines can induce a weaker unidirectional electric field which suffers from much less current leakage, compared to a bidirectional electric field created in word lines with equal such vertical distances.

The description presented above is merely that of some preferred embodiments of the present invention and does not limit the scope thereof in any sense. Any and all changes and modifications made by those of ordinary skill in the art based on the above teachings fall within the scope as defined in the appended claims.

What is claimed is:

1. An asymmetric fin field-effect transistor (FinFET) in a memory device, comprising:
a substrate having a plurality of active areas formed therein;
an isolation structure formed in the substrate and isolating the plurality of active areas, wherein the plurality of active areas are arranged in multiple rows;
a plurality of word lines formed in the substrate, the plurality of word lines crossing over the isolation structure and the active areas, wherein each of the active areas comprises a fin, a length of a first end of the fin on a first side of the active area and covered by the word line is different from a length of a second end of the fin on a second side of the active area and covered by the word line, each of the word lines crosses over several of the plurality of rows, and wherein in each of the crossed rows, the word line crosses over two adjacent active areas, and
wherein for each of the word lines, a bottom of a first portion of the word line between two active areas respectively located in two adjacent rows has a height difference of a with respect to a bottom of a second portion of the world line in the active area, and a bottom of a third portion of the word line between two active areas located in a same row has a height difference of b with respect to the bottom of the second portion of the world line in the active area, wherein a≠b, and |a−b|≥0.5*Min(a, b), wherein Min(a, b) represents a or b, whichever is smaller, wherein if a>b, then 1 nm≤a≤500 nm and 0.5 nm≤b≤300 nm, wherein if a<b, then 0<a≤300 nm and 0.5 nm≤b≤500 nm.

2. The asymmetric FinFET of claim 1, wherein the multiple rows are extending parallel to one another, and wherein the active areas in each row are arranged along a direction that is oriented at an acute angle with respect to a longitudinal direction of the active area.

3. The asymmetric FinFET of claim 1, wherein the isolation structure comprises a first isolation material layer over side walls of the active areas, the first isolation material layer having a thickness ranging from 1 nm to 200 nm.

4. The asymmetric FinFET of claim 3, wherein the isolation structure further comprises a second isolation material layer over the first isolation material layer, the first isolation material layer and the second isolation material have different etching rates, and the first isolation material layer is further formed on the bottom of the word lines located between two active areas respectively located in two adjacent rows, and on the bottom of the word lines located between two adjacent active areas in the same row, and wherein the second isolation material layer is formed on the bottom of the word lines located between two active areas respectively located in two adjacent rows.

5. The asymmetric FinFET of claim 1, wherein in a direction in which the word line extends, the active areas are spaced apart from one another at a first interval or at a second interval, the first interval being greater than the second interval, and wherein a top of the isolation structure in the first interval is higher than a top of the isolation structure in the second interval so that for each of the active areas, a depth of extension of a first bottom part of the world line covering the first side of the active area and corresponding to the first interval is smaller than a depth of extension of a second bottom part of the world line covering the second side of the active area and corresponding to the second interval.

6. The asymmetric FinFET of claim 1, wherein in a direction in which the word line extends, the active regions are spaced apart from one another at a first interval or at a second interval that is smaller than the first interval, and wherein a top of the isolation structure in the first interval being lower than a top of the isolation structure in the second interval so that for each of the active areas, a depth of extension of a first bottom part of the world line covering the first side of the active area and corresponding to the first interval is greater than a depth of extension of a second bottom part of the world line covering the second side of the active area and corresponding to the second interval.

7. A method for fabricating an asymmetric fin field-effect transistor (FinFET) in a memory device, comprising:
providing a substrate;
forming an isolation structure in the substrate, the isolation structure defining and isolating a plurality of active areas, wherein the plurality of active areas are arrange in multiple rows; and
forming a plurality of word lines in the substrate, the plurality of word lines crossing over the isolation structure and the active areas, wherein each of the active areas comprises a fin, a length of a first end of the fin on a first side of the active area and covered by the word line is different from a length of a second end of the fin on a second side of the active area and covered by the word line so as to reduce a current leakage, each of the word lines crosses over several of the plurality of rows, and wherein in each of the crossed rows, the word line crosses over two adjacent active areas, and
wherein for each of the word line, a bottom of a first portion of the word line between two active areas respectively located in two adjacent rows has a height difference of a with respect to a bottom of a second portion of the world line in the active area, and a bottom of a third portion of the word line between two active areas located in a same row has a height difference of b with respect to the bottom of the second portion of the world line in the active area, wherein a≠b, and |a−b|≥0.5*Min(a, b), wherein Min(a, b) represents a or b, whichever is smaller, wherein if a>b, then 1 nm≤a≤500 nm and 0.5 nm≤b≤300 nm, wherein if a<b, then 0<a≤300 nm and 0.5 nm≤b≤500 nm.

8. The method of claim 7, wherein the formation of the isolation structure comprises:
etching the substrate to form therein first insulating isolation trenches and second insulating isolation trenches to define and isolate multiple rows of active area mesas, the rows extending parallel to one another, the active areas in each row arranged along a direction that is oriented at an acute angle with respect to a longitudinal direction of the active area mesas, the active area mesas in each row being joined at bottoms, the first insulating isolation trenches spacing apart the active area mesas of the same rows, the second insulating isolation trenches separating the rows from one another;
forming a first isolation material layer over the first insulating isolation trenches and the second insulating isolation trenches, the first isolation material layer covering the active areas mesas and having a thickness that is smaller than a height of the active area mesas;
forming a second isolation material layer over the first isolation material layer, the first and second isolation material layers serving as a material layer for the isolation structure;
planarizing the material layer to form the isolation structure, the isolation structure having a top surface that is flush with a top surface of the active area mesas; and
forming the active areas by doping the active area mesas.

9. The method of claim 8, wherein adjacent active area mesas in each row are differently doped.

10. The method of claim 8, wherein the formation of the plurality of word lines in the substrate comprises:
etching the first and second isolation material layers with an etchant having different etching rates for the first and second isolation material layers, thereby forming first word-line trenches between the active areas of adjacent rows and second word-line trenches between adjacent active areas in same rows;
etching the active areas to form third word-line trenches, with bottoms of the first word-line trenches and of the second word-line trenches serving as an etching mask, all the first word-line trenches, the second word-line trenches and the third word-line trenches serving as trenches to form the word lines, wherein a height difference from bottoms of the first word-line trenches to bottoms of the third word-line trenches is denoted as a, and a height difference from bottoms of the second word-line trenches to the bottoms of the third word-line trenches as b, there is a≠b; and
forming the plurality of word lines in the first, second and third word-line trenches.

11. A semiconductor device, comprising:
a substrate;
a plurality of array structures formed in the substrate, wherein the plurality of array structures are arranged in multiple rows;
a surrounding structure formed in the substrate and isolating both outside and inside of the array structures; and
a plurality of penetrating structures formed in the substrate and crossing over the array structures and portions of the surrounding structure among the array structures, wherein for each of the array structures crossed by the corresponding penetrating structure, a length of a first side portion of the array structure covered by a bottom part of the penetrating structure is different from a length of a second side portion of the array structure covered by the bottom part of the penetrating structure, each of the penetrating structures crosses over several of the plurality of rows, and wherein in each of the crossed rows, the penetrating structure crosses over two adjacent array structures, and
wherein for each of the penetrating structures, a bottom of a first portion of the penetrating structure between two array structures respectively located in two adjacent rows has a height difference of a with respect to a bottom of a second portion of the penetrating structure in the array structure, and a bottom of a third portion of the penetrating structure between two array structures located in a same row has a height difference of b with respect to the bottom of the second portion of the penetrating structure in the array structure, wherein a≠b, and |a−b|≥0.5*Min(a, b), wherein Min(a, b) represents a or b, whichever is smaller, wherein if a>b, then 1 nm≤a≤500 nm and 0.5 nm≤b≤300 nm, wherein if a<b, then 0<a≤300 nm and 0.5 nm≤b≤500 nm.

12. The semiconductor device of claim 11, wherein the surrounding structure comprises a first isolation material layer over side walls of the array structures and a second isolation material layer over the first isolation material layer, the first isolation material layer and the second isolation material have different etching rates, and the first isolation material layer is further formed on the bottom of the penetrating structures located between two array structures respectively located in two adjacent rows, and on the bottom of the penetrating structures located between two adjacent array structures in the same row, and wherein the second isolation material layer is formed on the bottom of the penetrating structures located between two array structures respectively located in two adjacent rows.

* * * * *